United States Patent
Cherif et al.

(10) Patent No.: US 12,395,155 B2
(45) Date of Patent: Aug. 19, 2025

(54) DYNAMIC CURRENT-MODE FINITE IMPULSE RESPONSE FILTER

(71) Applicant: NORTHROP GRUMMAN SYSTEMS CORPORATION, Falls Church, VA (US)

(72) Inventors: Bouchaib Cherif, Yorktown Heights, NY (US); Isidoros Doxas, Columbia, MD (US); Philippe Pouliquen, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 143 days.

(21) Appl. No.: 18/394,894

(22) Filed: Dec. 22, 2023

(65) Prior Publication Data

US 2025/0211207 A1    Jun. 26, 2025

(51) Int. Cl.
*H03H 17/06* (2006.01)
*H03H 17/02* (2006.01)
*H03H 17/00* (2006.01)

(52) U.S. Cl.
CPC ........ *H03H 17/06* (2013.01); *H03H 17/0227* (2013.01); *H03H 17/0294* (2013.01); *H03H 2017/0081* (2013.01)

(58) Field of Classification Search
CPC ............... H03H 17/06; H03H 17/0227; H03H 17/0294; H03H 2017/0081
USPC .......................................................... 340/50
See application file for complete search history.

(56) References Cited

U.S. PATENT DOCUMENTS

| | | | | | |
|---|---|---|---|---|---|
| 5,097,155 A | * | 3/1992 | Liu | ......................... | H03H 19/00 |
| | | | | | 327/552 |
| 5,367,476 A | * | 11/1994 | Elliott | ..................... | H03H 17/06 |
| | | | | | 708/316 |
| 5,414,311 A | * | 5/1995 | Carley | ................. | G11C 27/024 |
| | | | | | 327/552 |
| 5,563,819 A | * | 10/1996 | Nelson | ................... | H03H 15/02 |
| | | | | | 708/819 |
| 5,796,243 A | | 8/1998 | Kimura | | |

(Continued)

*Primary Examiner* — Zhen Y Wu
(74) *Attorney, Agent, or Firm* — KATTEN MUCHIN ROSENMAN LLP

(57) ABSTRACT

The proposed dynamic current-mode finite impulse response (FIR) filter includes a coefficient signal generator to generate a coefficient signal, an input signal generator to generate an input signal, a dynamic current multiplier configured to receive the input signal and the coefficient signal and to generate intermediate product terms that are multiplications of the coefficient values and reflected and shifted input values, and an accumulator configured to receive the intermediate product terms and to sequentially integrate the intermediate product terms over the coefficient values to produce output responses for the input values. The dynamic current multiplier includes a first dynamically configured transistor (DCT) having a first input node to receive the first input signal during a first phase of operation and a second input node to receive the second input signal during a second phase of operation, and a second DCT having an input node to receive a third input signal during a first phase of operation, and output the intermediate product terms during a second phase of operation.

13 Claims, 5 Drawing Sheets

(56) References Cited

U.S. PATENT DOCUMENTS

| | | | | |
|---|---|---|---|---|
| 5,931,899 | A * | 8/1999 | Kertis | G06G 7/163 |
| | | | | 708/835 |
| 6,032,171 | A * | 2/2000 | Kiriaki | H03H 15/00 |
| | | | | 708/319 |
| 6,233,598 | B1 * | 5/2001 | Kertis | G11B 5/52 |
| 6,243,729 | B1 | 6/2001 | Staszewski | |
| 6,791,399 | B2 * | 9/2004 | Jaussi | H03H 15/00 |
| | | | | 327/552 |
| 6,859,814 | B2 * | 2/2005 | Kiriaki | H03H 17/06 |
| | | | | 708/319 |
| 7,081,797 | B1 | 7/2006 | Bowers | |
| 7,248,189 | B2 * | 7/2007 | Sinha | H03H 17/0685 |
| | | | | 341/61 |
| 7,265,527 | B1 | 9/2007 | Haug | |
| 11,032,167 | B2 * | 6/2021 | Shayovitz | H04L 43/028 |
| 11,522,525 | B2 * | 12/2022 | Subramanian | H03H 11/265 |
| 2001/0056450 | A1 * | 12/2001 | Kiriaki | H03H 15/00 |
| | | | | 708/319 |
| 2005/0286623 | A1 * | 12/2005 | Jaussi | H03H 15/00 |
| | | | | 375/232 |
| 2007/0092040 | A1 * | 4/2007 | Higashino | H04L 7/10 |
| | | | | 375/376 |
| 2017/0070210 | A1 * | 3/2017 | Kultran | H03H 15/00 |
| 2021/0376818 | A1 * | 12/2021 | Subramanian | H03H 17/08 |

* cited by examiner

DYNAMIC CURRENT-MODE FINITE IMPULSE RESPONSE FILTER

BACKGROUND

Finite impulse response (FIR) filters use a finite set of coefficients that are convolved with the input signal to produce the output responses for the input values. The FIR filter is one type of digital filter used in digital signal processing. FIR filters can be constructed with continuous time, analog or digital and discrete time signals. FIR filters use operations known as convolution. For example, an Nth order discrete time FIR filter uses N coefficient values and performs convolution operations with the coefficient values and the input values to output the filter's responses.

The FIR filters include electrical circuits to perform the convolution operations. Conventionally, the FIR filters may include a continuous current multiplier that employs multiple current-mode circuits. However, the conventional current-mode circuits necessitate the use of large transistors to mitigate mismatch. For example, in the in-pixel filtering of images on an image sensor, spatial and temporal filtering must be applied at a point closest to the photon transduction in order to benefit from lower power. However, there are strong area constraints for in-pixel circuits, and many desirable conventional current mirror circuits cannot fit in modern pixel pitches.

There are needs to provide compact and efficient electrical circuits for FIR filters that can be used in image sensors with fine pixel pitches, solving the issues of the conventional FIR filters.

SUMMARY

The disclosed invention provides a dynamic current-mode finite impulse response (FIR) filter that combines dynamic current mirrors (DCMs) and the dynamic current multiplier to perform basic filtering operation in a discrete time and continuous amplitude modality. The novel approach to the filtering is achieved by combining a novel dynamic current multiplier with DCMs. The dynamic current multiplier and DCMs of the FIR filter of the disclosed invention allow the design of circuits that are more compact than those of traditional continuous multipliers and mirrors.

These advantages and others are achieved, for example, by a dynamic current-mode finite impulse response (FIR) filter that includes a coefficient signal generator, an input signal generator, a dynamic current multiplier, and an accumulator. The coefficient signal generator is configured to generate a coefficient signal that includes a plurality of continuous or discrete amplitude coefficient values. The input signal generator is configured to generate an input signal that includes a plurality of continuous or discrete amplitude input values. The input signal generator includes a plurality of dynamic current mirrors (DCMs) to output the continuous or discrete amplitude input values. The dynamic current multiplier is configured to receive the input signal and the coefficient signal and to generate intermediate product terms that are multiplications of the coefficient values and reflected and shifted input values. The accumulator is configured to receive the intermediate product terms and to sequentially integrate the intermediate product terms over the coefficient values to produce output responses for the input values. The dynamic current multiplier includes a first dynamically configured transistor (DCT) and a second DCT. The first DCT includes an input node to receive the first input signal during a first phase of operation and a second input signal during a second phase of operation. The second DCT includes an input node to receive a third input signal during a first phase of operation and to output the intermediate product terms during a second phase of operation. A source node of the first DCT is coupled to a source node of the second DCT.

These advantages and others are also achieved, for example, by a method to produce desired output responses by using a dynamic current-mode finite impulse response (FIR) filter. The method includes steps of receiving an input signal at an input node of a first dynamically configured transistor (DCT), receiving a coefficient signal at a coefficient input node, normalizing intermediate product terms that are multiplications of the coefficient values and reflected and shifted input values, outputting the normalized intermediate product terms at an output node of a second DCT, and sequentially integrating the normalized intermediate product terms over the coefficient values to produce output responses for the input values. The input signal includes a plurality of continuous or discrete amplitude input values. The input values are generated by an input signal generator including a plurality of dynamic current mirrors (DCMs) to output the input values. The coefficient signal includes a plurality of continuous or discrete amplitude coefficient values. A source node of the first DCT is coupled to a source node of the second DCT.

BRIEF DESCRIPTION OF THE DRAWINGS

The preferred embodiments described herein and illustrated by the drawings hereinafter are to illustrate and not to limit the invention, where like designations denote like elements.

DETAILED DESCRIPTION

Figure 1:
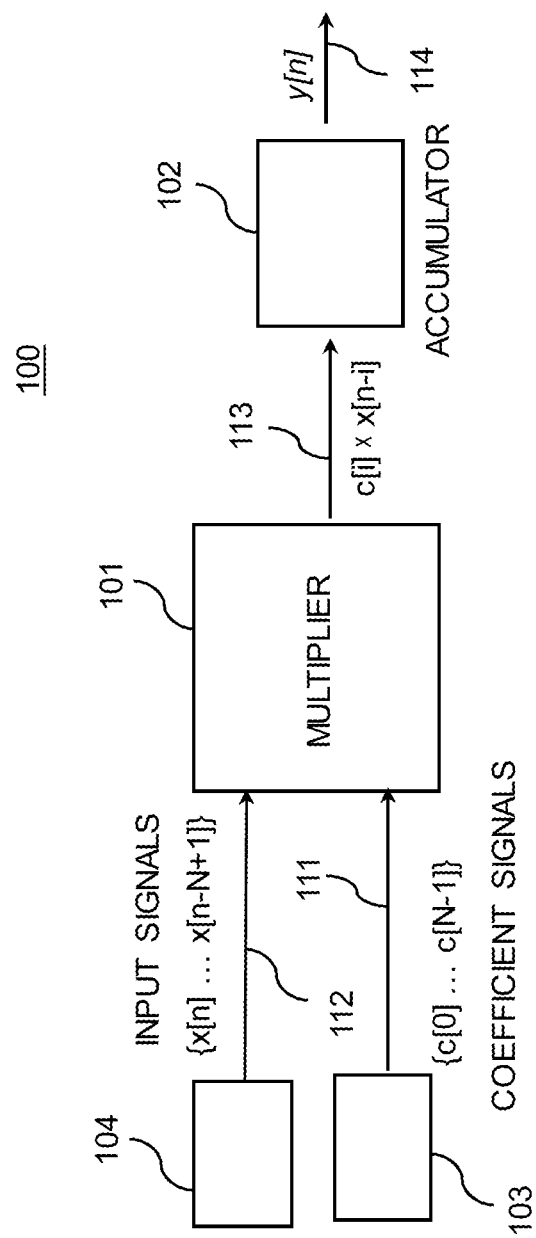
FIG. 1 is a diagram of finite impulse response (FIR) filter.

The following detailed description is merely exemplary in nature and is not intended to limit the described embodiments or the application and uses of the described embodiments. All of the implementations described below are exemplary implementations provided to enable persons skilled in the art to make or use the embodiments of the disclosure and are not intended to limit the scope of the disclosure, which is defined by the claims. It is also to be understood that the drawings included herewith only provide diagrammatic representations of the presently preferred structures of the present invention and that structures falling within the scope of the present invention may include structures different than those shown in the drawings.

With reference to FIG. 1, shown is a diagram of finite impulse response (FIR) filter 100 of the disclosed invention. The FIR filter 100 uses a finite set of coefficients c[i] 111 which are convolved with the input signal x[n] 112 to produce the output y[n] 114. For an Nth order discrete time FIR filter, there are N coefficient signals c[i](i=0 . . . N−1). The basic computation needed for the FIR filter is a summation y[n]=$\Sigma_{i=0}^{N-1}$c[i]× x[n−i], where c[i](i=0 . . . N−1) are coefficient signals and x[n](n=0, 1, . . . ) are input signals. The control unit (not shown) of the FIR filter 100 cycles over the N values of the variable i to compute a value for each output sample y[n].

Referring to FIG. 1, the FIR filter 100 includes current multiplier 101, accumulator 102, input signal generator 104, and coefficient signal generator 103. The input signal generator 104 generates an input signal that includes a plurality of continuous or discrete amplitude input values x[n](n=0, 1, . . . ) 112. The coefficient signal generator 104 generates a coefficient signal that includes a plurality of continuous or discrete amplitude coefficient values c[i](i=0 . . . N−1) 111. The multiplier 101 receives N coefficient signals c[i] 111 from coefficient signal generator 103 and receives a subset of N input signals x[n] to x[n−N+1] 112 from an input signal generator 104. The current multiplier 101 generates intermediate product terms 113 that are multiplications (c[i]×x[n−i]) of the coefficient values c[i] and reflected and shifted input values x[n−i]. The accumulator 102 receives the intermediate product terms 113 from the multiplier 101 and generates the output response y[n] 114 for the input value x[n], where y[n]=$\Sigma_{i=0}^{N-1}$c[i]×x[n−i]. The accumulator 102 sequentially integrates the intermediate product terms over the N coefficient values c[i](i=0 . . . N−1) 111 and the N input signals x[n] to x[n−N+1] to produce the output responses y[n] 114 for each input value x[n]. This operation is known as a convolution operation. Although in this example the input signals x[n] to x[n−N+1] are temporal samples of signal x, the FIR is not limited to temporal filtering. In some cases the input signal can be a spatial distribution of inputs x[i,j], or even a mix of spatial and temporal inputs x[n,i,j]. The same operations can still be performed, the only limitation being that the set of coefficients is finite.

The disclosed invention provides novel electrical circuits for the current-mode FIR filter 100 to improve the filtering operations. For example, the FIR filter 100 of the disclosed invention improves in-pixel filtering of images on image sensors. In the in-pixel filtering applications, spatial and temporal filtering must be applied at a point closest to the photon transduction in order to benefit from low power. However, there are strong area constraints for in-pixel circuits, and many desirable circuit topologies may not fit in modern pixel pitches. The electrical circuits of the disclosed invention for the FIR filter 100 enables the spatial and temporal filtering to be applied at the closest point to the photon transduction of image sensors.

The FIR filter 100 of the disclosed invention utilizes circuits that combines dynamic current mirrors (DCMs) and dynamic current multiplier for the required filtering operations in a discrete time with discrete or continuous amplitude FIR filtering. In an embodiment, the input signal 112 may be discrete time and discrete amplitude input signal x[n] as described herein, and the FIR filter 100 outputs discrete time output response y[n] which may be quantized into a discrete value signal by further processing. In another embodiment, the input signal 112 may be discrete time and continuous amplitude input signal x[n] as described herein, and the FIR filter 100 outputs discrete time and continuous amplitude output response y[n].

Figure 2:
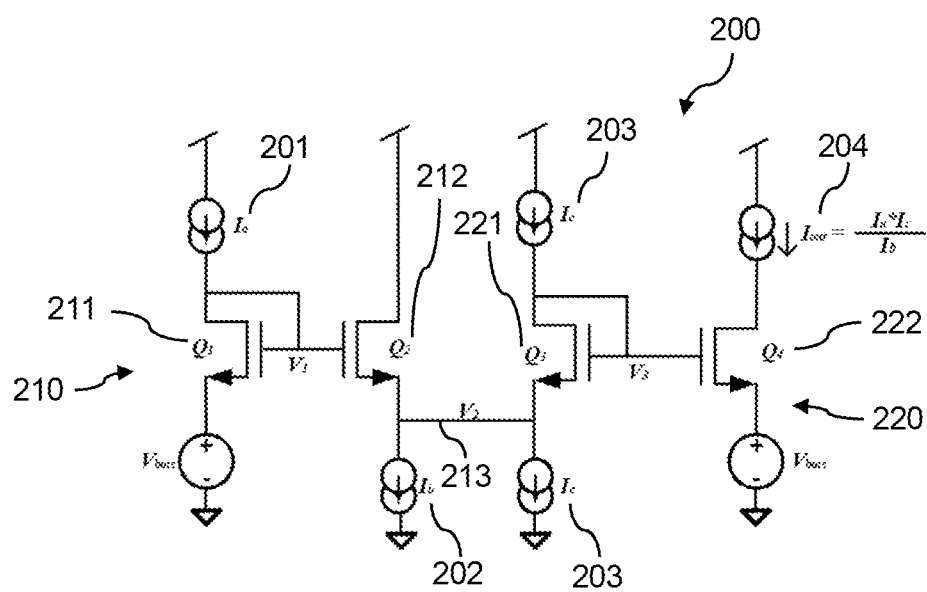
FIG. 2 is an exemplary circuit diagram of typical translinear current multiplier.

With reference to FIG. 2, shown is a circuit diagram of a conventional translinear current multiplier 200. The typical translinear current multiplier 200 includes two transistor pairs 210, 220. The transistor pair 210 includes transistors Q1, Q2 211, 212, and the transistor pair 220 includes transistors Q3, Q4 221, 222. The transistor pairs 210, 220 are connected to each other through line 213. The current $I_a$ 201 flowing into the drain of transistor Q1 211 serves as a first input current, and the current $I_b$ 202 flowing out from the source of transistor Q2 212 serves as a second input current. The current $I_c$ 203 flowing into the drain of the transistor Q3 221 and out from the source of transistor Q3 221 serves as a third input current. The third current $I_c$ 203 to the multiplier 200 is supplied twice as a current source and as a current sink. The current Iout 204 flowing into the drain of the transistor Q4 222 serves as an output current of this translinear current multiplier 200, where $$I_{out} = \frac{I_a I_c}{I_b}.$$

The operation of the translinear current multiplier depends on the exponential relationship between the gate voltage of the transistors and their drain current. That is, $$I_D = I_0 e^{\frac{kV_{GS}}{V_t}}$$

where k, $V_t$ and $I_0$ are parameters, $V_{GS}$ is the gate to source voltage and ID is the drain current. For transistor Q1, $$I_a = I_0 e^{\frac{k(V_1 - V_{bias})}{V_t}},$$

and therefore $$V_1 = V_{bias} + \frac{V_t}{k} \ln\left(\frac{I_a}{I_0}\right).$$

For transistor Q2, $$I_b = I_0 e^{\frac{k(V_1 - V_2)}{V_t}},$$

and therefore $$V_1 - V_2 = \frac{V_t}{k} \ln\left(\frac{I_b}{I_0}\right).$$

resulting in $$V_2 = V_{bias} + \frac{V_t}{k} \ln\left(\frac{I_a}{I_b}\right).$$

Similarly, for transistor Q3, $$I_c = I_0 e^{\frac{k(V_3 - V_{bias})}{V_t}},$$

and therefore $$V_3 - V_2 = \frac{V_t}{k}\ln\left(\frac{I_c}{I_0}\right),$$

resulting in $$V_3 = V_{bias} + \frac{V_t}{k}\ln\left(\frac{I_a I_c}{I_b I_0}\right).$$

For transistor Q4, $$I_{out} = I_0 e^{\frac{k(V_3 - V_{bias})}{V_t}},$$

and therefore $$V_3 - V_{bias} = \frac{V_t}{k}\ln\left(\frac{I_{out}}{I_0}\right),$$

resulting in $$V_3 = V_{bias} + \frac{V_t}{k}\ln\left(\frac{I_{out}}{I_0}\right).$$

Therefore $$I_{out} = \frac{I_a I_c}{I_b}.$$

The typical current multiplier 200 is generally well suited for applications that are less sensitive to process variations, or have ample space available to allow the use of large, well-matched transistors. However, the typical current multiplier 200 must operate the transistors in the subthreshold region in order to perform the translinear operations, and therefore has issues when it is used for compact applications. In the subthreshold region, the current multiplier 200 will be very sensitive to process non-uniformity. The FIR filter of the disclosed invention is proposed to overcome the issues of FIR filters using the conventional translinear current multiplier, by achieving similar accuracy without the need for large, well-matched transistors.

Figure 3:
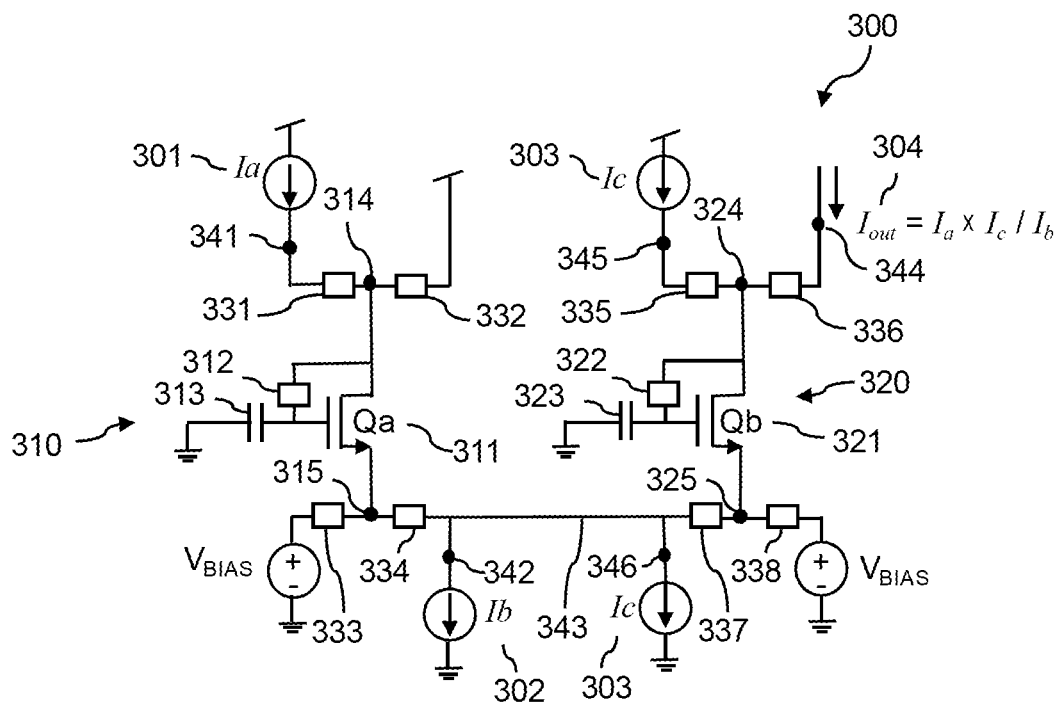
FIG. 3 is a circuit diagram of dynamic current multiplier of the disclosed invention that is configured to be used for the FIR filter shown in FIG. 1.

With reference to FIG. 3, shown is a circuit diagram of dynamic current multiplier 300 of the disclosed invention that is configured to be used for the dynamic FIR filter 100. The dynamic current multiplier 300 utilizes dynamically configured transistors (DCTs) instead of transistor pairs, which are similar to dynamic current mirrors (DCMs), to provide a high precision current multiplier. The dynamic current multiplier 300 includes first DCT 310 and second DCT 320. Each of the first and second DCTs 310, 320 includes a drain node 314, 324, a source node 315, 325, a transistor 311, 321, an internal switch 312, 322, and at least one capacitor 313, 323. A drain of the transistor 311, 321 is connected to the drain node 314, 324, and a source of the transistor 311, 321 is connected to the source node 315, 325. A first terminal of the internal switch 312, 322 is connected to the drain node 314, 324, and a second terminal of the internal switch 312, 322 is connected to a gate of the transistor 311, 321. The internal switch 312, 322 is configured to be turned on and off by an external control signal. A first terminal of the capacitor 313, 323 is connected to the second terminal of the internal switch 312, 322 and the gate of the transistor 311, 321.

The source nodes 315, 325 of the first and second DCTs 310, 320 are electrically coupled to each other through line 343 and switches 334, 337. Herein, "coupled" means that the elements are capable of being electrically connected. For example, the source nodes 315, 325 are electrically connected when both switches 334, 337 are turned on, while the source nodes 315, 325 are electrically disconnected when one of the switches 334, 337 is turned off. Even though the source nodes 315, 325 may be electrically disconnected at a certain condition, the source nodes 315, 325 are electrically coupled because the source nodes 315, 325 can be electrically connected when both switches 334, 337 are turned on.

The DCT 310, 320 includes a single transistor and operates like a time-multiplexed transistor pair that samples a voltage representing an input current on the gate of a transistor and outputs a current that is controlled by the same gate voltage. Unlike the conventional transistor pair 210 shown in FIG. 2, the DCT 310 includes a single transistor 311 to replicate the functions of transistors Q1, Q2 211, 212. The DCT 310 is configured to be switched between a first mode and second mode by a control signal 541 supplied by controller 540 (see FIG. 5).

During a first phase of operation of DCT 310, the internal switch 312 of the first DCT 310 is turned on. At this time, the switches 331, 333 are turned on (i.e., the switches 331, 333 are closed) while the switches 332, 334 are turned off (i.e., the switches 332, 334 are open), and the DCM 310 receives the input current $I_a$ 301 through the first input node 341, the switch 331 and the drain node 314 of the DCT 310. Because the internal switch 312 is turned on, the gate of the transistor Qa 311 is driven to the appropriate voltage of $$V_{bias} + \frac{V_t}{k}\ln\left(\frac{I_a}{I_0}\right)$$

(which is the same voltage as $V_1$ in the continuous translinear current multiplier of FIG. 2) to pass input current $I_a$ 301. The capacitor 313 retains the voltage (or charges) of the gate of the transistor Qa 311 during the subsequent phase(s). During a second phase of operation of DCT 310, the internal switch 312 of the first DCT 310 is turned off. At this time, the switches 331, 333 are turned off and the switches 332 and 334 are turned on. Because the internal switch 312 is turned off, the gate of the transistor Qa 311 is disconnected from the drain node 314 and is driven by the voltage (charges) of the capacitor 313, which is retained from the first phase of operation of DCT 310. Consequently, transistor Qa 311 acts as a voltage follower biased by current $I_b$, such that the voltage at the source node 315 is given by V $$V_{bias} + \frac{V_t}{k}\ln\left(\frac{I_a}{I_b}\right)$$

(which is the same voltage as $V_2$ in the continuous translinear current multiplier of FIG. 2).

The second DCT 320 operates in a similar way as described for the first DCT 310, except that the source bias is now $$V_{bias} + \frac{V_t}{k}\ln\left(\frac{I_a}{I_0}\right)$$

instead of $V_{bias}$. During the first phase of operation of DCT 320, which overlaps with the second phase of operation of DCT 310, the internal switch 322 of the DCT 320 is turned on. At this time, the switches 335, 337 are turned on while the switches 336, 338 are turned off, and the DCT 320 receives the third input current $I_c$ 303 through the switch 335 and the drain node 324. Because the internal switch 322 is turned on, the gate of the transistor Qb 321 is driven to the appropriate voltage of $$V_{bias} + \frac{V_t}{k}\ln\left(\frac{I_a I_c}{I_b I_0}\right)$$

(which is the same voltage as $V_3$ in the continuous translinear current multiplier of FIG. 2) to pass input current Ic 303 with a source voltage of $$V_{bias} + \frac{V_t}{k}\ln\left(\frac{I_a}{I_b}\right).$$

The capacitor 323 retains the voltage (or charges) of the gate of the transistor Qb 321 during subsequent phase(s) of operation.

During the second phase of operation of DCT 320, which may overlap with the first phase of operation of DCT 310, the internal switch 322 of the DCT 320 is turned off. At this time, the switches 335, 337 are turned off and the switches 336 and 338 are turned on. Because the internal switch 322 is turned off, the gate of the transistor Qb 321 is disconnected from the drain node 324 and is driven by the voltage (charges) of the capacitor 323, which is retained from the first phase of operation of DCT 320. Moreover, during the second phase of operation of DCT 320, because the switch 338 is turned on, the source of transistor Qb 321 is connected to $V_{bias}$. Consequently, during the second phase of operation, this circuit produces multiplication current Iout 304 flowing into the drain of the transistor Qb 321, which is an output current Iout 304 of the dynamic current multiplier 300, where Iout=Ia×Ic/Ib.

In summary, the current $I_a$ 301, which flows into the drain of the transistor Qa 311 during the first phase of the operation of DCT 310 serves as a first input current, and the current Ib 302 flowing out from the source of the transistor Qa 311 during the second phase of the operation of DCT 310 serves as a second input current. The current $I_c$ 303, which flows into the drain of the transistor Qb 321 and out of the source of the transistor Qb 310 during the first phase of the operation of DCT 320 serves as a third input current. The third input current Ic 303 to the dynamic current multiplier 300 is supplied twice as a current source at node 345 and as a current sink at node 346. The current Iout 304 (Iout=Ia× Ic/Ib) flowing into the drain of the transistor Qb 321 serves as an output current of the dynamic current multiplier 300, which are the intermediate product terms 113 shown in FIG. 1.

In the disclosed invention, the current multiplier 101 of the FIR filter 100 shown in FIG. 1 employs the dynamic current multiplier 300 shown in FIG. 3. The input signals x[n] to x[n−N+1] 112 are sequentially supplied as the first input current $I_a$ 301 of the dynamic current multiplier 300.

The coefficient signals c[0] to c[N−1] 111 are sequentially supplied as the second input current Ib 302, which requires storing the coefficients as their reciprocal (that is, Ib=1/c[i]). The third input current $I_c$ 303 is supplied to the dynamic current multiplier 300 to normalize the output Iout that is the intermediate product terms. Alternatively, the coefficient signals can be supplied as the third input current $I_c$ 303, and $I_b$ 302 can be used to normalize the output. A person skilled in the art will recognize that other permutations of the three input currents are also viable.

FIG. 3 exemplarily shows n-channel metal-oxide semiconductor (NMOS) transistors for the transistors 311, 321. However, the transistors 311, 321 may be p-channel metal-oxide semiconductor (PMOS) transistors, bipolar junction transistors or any other types of device exhibiting exponential relationship between a current and a voltage. The switches 312, 322, and 331-338 may be NMOS transistors, PMOS transistors, bipolar junction transistors or many other types of transistors.

Figure 4:
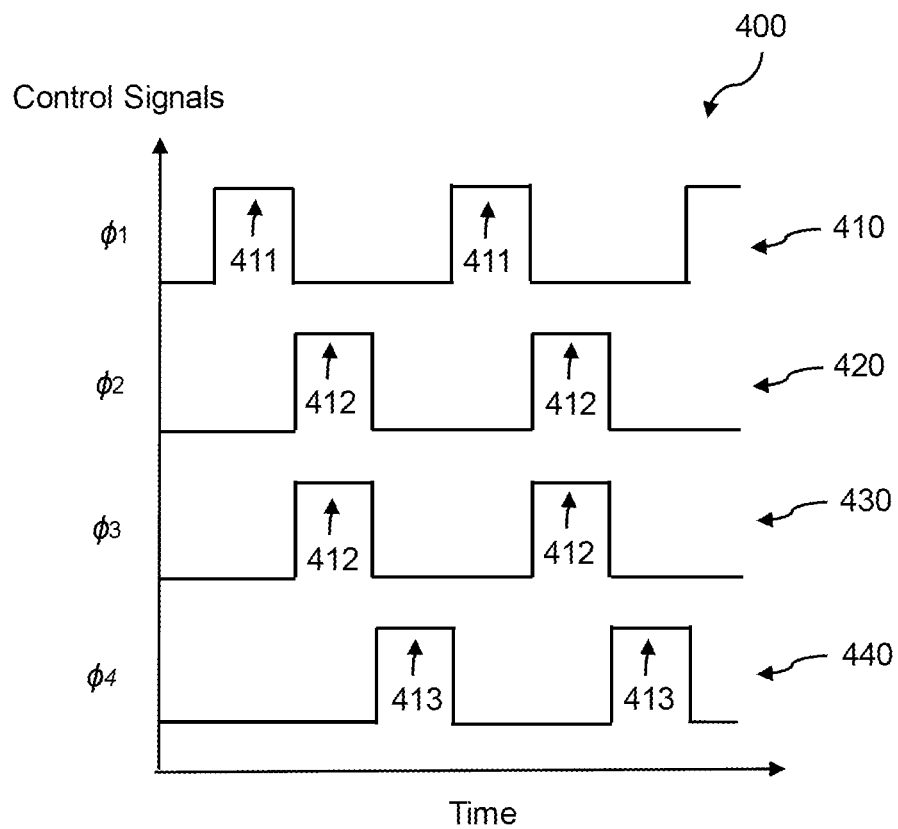
FIG. 4 shows an exemplary diagram of clock control signals that may be applied to the switches shown in FIG. 3.

With reference to FIG. 4, shown is an exemplary diagram of clock control signals 400 that may be applied to control the switches shown in FIG. 3. The first control signal 410 has a phase ϕ1, the second control signal 420 has a phase ϕ2, the third control signal 430 has a phase ϕ3, the fourth control signal 440 has a phase ϕ4. The first control signal 410 may be applied to the switches 331, 312, and 333 to control on/off operations of these switches. For example, with the first control signal 410, the switches 331, 312, and 333 may be turned on during the first phase 411 and may be turned off during the second phase 412 and the third phase 413. The second control signal 420 may be applied to the switches 332 and 334 to control on/off operations of these switches. For example, with the second control signal 420, the switches 332 and 334 may be turned off during the first phase 411 and the third phase 413, and may be turned on during the second phase 412. The third control signal 430 may be applied to the switches 335, 322 and 337 to control on/off operations of these switches. For example, with the third control signal 430, the switches 335, 322 and 337 may be turned off during the first phase 411 and the third phase 413, and may be turned on during the second phase 412. The fourth control signal 440 may be applied to the switches 336 and 338 to control on/off operations of these switches. For example, with the fourth control signal 440, the switches 336 and 338 may be turned off during the first phase 411 and the second phase 412, and may be turned on during the third phase 413.

A person skilled in the art will recognize that the operation of the control signals can also be pipelined. That is, the switches controlled by phase ϕ1 410 and phase ϕ4 440 can be operated simultaneously, so that parts of the multiplication for index i can overlap with those of i+1, which improves the throughput of the FIR computation. A person skilled in the art will also recognize that inserting idle states into the timing of the control signal may be desirable or necessary to, for example, ensure that there is no overlap between mutually exclusive switches.

Figure 5:
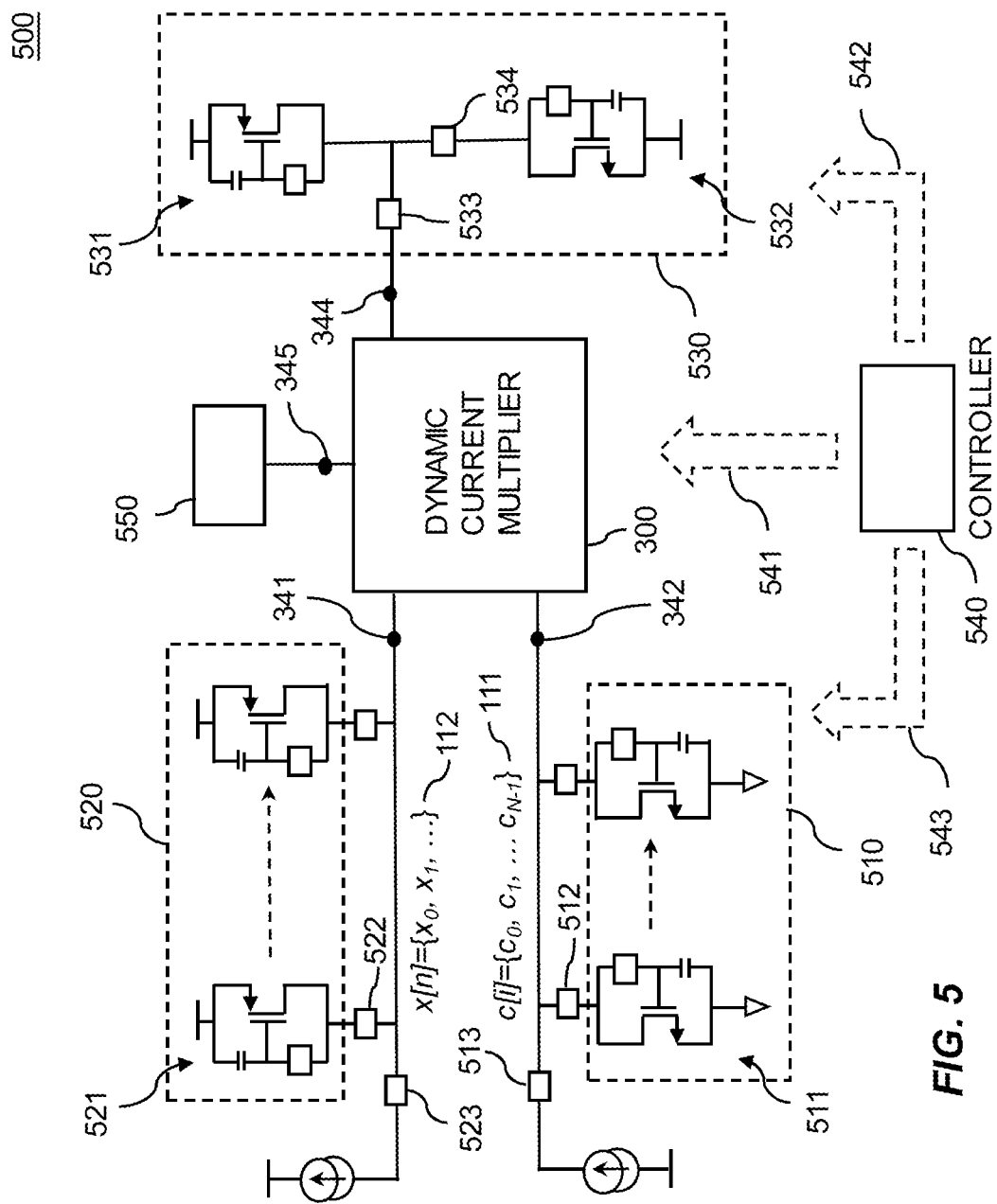
FIG. 5 shows a circuit diagram of the dynamic current-mode FIR filter of the disclosed invention, which employs dynamic current multiplier shown in FIG. 3.

With reference to FIG. 5, shown is a diagram of the dynamic current-mode FIR filter 500 of the disclosed invention, which employs dynamic current multiplier 300 shown in FIG. 3. The FIR filter 500 includes coefficient signal generator 510, input signal memory 520, dynamic current multiplier 300, and accumulator 530. The current-mode FIR filter 500 may further include controller 540 to control the operations of switches and elements included in the FIR filter 500 with control signals 541, 542, 543. The controller 540 may be a typical controller that generates clock signals that are configured to operate transistors or the other types of switches.

The coefficient signals c[i] 111 can be generated by either dynamic current mirrors (DCMs) or continuous current sources. FIG. 5 exemplarily shows the coefficient signal generator 510 including DCMs 511. However, the DCMs 511 may be replaced with continuous-time current sources in the circuit of the coefficient signal generator 510. For the Nth order discrete time FIR filter, there may be N DCMs to sequentially generate coefficient signals c[i](i=0, . . . , N−1) 111. In an embodiment, if the input signals contain time samples of the input signal x[n] 112, then these samples x[n−i] are stored in DCMs. The input signal memory 520 includes a finite number of DCMs 521 to generate input signals x[i](i=n, . . . , n−N+1) 112. The input signal memory 520 implements either a circular buffer or a shift registers circuit for the input temporal samples so that new samples can be added, and the oldest samples discarded. FIG. 5 exemplarily shows the coefficient signal generator 510 includes DCMs 511 having an NMOS transistor and the input signal memory 520 includes DCMs 521 having a PMOS transistor. However, the transistors for the DCMs of the coefficient signal generator 510 and the input signal memory 520 are not limited to these transistors.

The third input signal $I_c$ 303 is supplied to the third input node 345 by the third input signal source 550. The third input signals 303 may be generated by either DCMs or continuous-time current sources. The input signal x[n−i] 112 is supplied to the dynamic current multiplier 300 via the first input node 341, and the coefficient signal c[i] 111 is supplied to the dynamic current multiplier 300 via the second input node 342. The dynamic current multiplier 300 produces the intermediate product terms c[i]×x[n−i] and use the third input signal 303 to normalize the intermediate product terms. The normalized intermediate product terms are output at the output node 344.

The accumulator 530 receives the normalized intermediate product terms c[i]×x[n−i] and performs integration or summation operations: $y[n]=\Sigma_{i=0}^{N-1}c[i]\times x[n-i]$. The accumulator 530 includes two DCMs 531, 532. During a first phase of operation of the accumulator 530, the normalized intermediate product term c[i]×x[n−i] from the dynamic current multiplier 300 is added to the running sum supplied by DCM 532, and stored in DCM 531. The running sum is $\Sigma_{j=0}^{i-1}c[j]\times x[n-j]$. During a second phase of operation of the accumulator 530, the current from DCM 531 is transferred in DCM 532, such that DCM 532 now stores $\Sigma_{j=0}^{i-1}c[j]\times x[n-j]$. The process is then repeated for the next step (i+1). Note that for the first step (i=0), the content of DCM 532 is not added to the first intermediate product term c[0]×x[n]. At the end of the N cycles, the output y[n] of the FIR filter 500 is available from either DCM. The switch 553 controls timing to send the intermediate product terms to accumulator 530, and the switch 534 controls timing to send the previously sequentially integrated intermediate product terms from DCM 532 to DCM 531 and to send newly integrated intermediate product terms from DCM 531 to DCM 532. In an embodiment, the DCM 531 may be PMOS DCM including a PMOS transistor, and the DCM 532 may be NMOS DCM including an NMOS transistor. However, the transistors of the DCMs 531, 532 are not limited to these. The DCMs 531, 532 may include opposite types of transistors.

Figure 6:
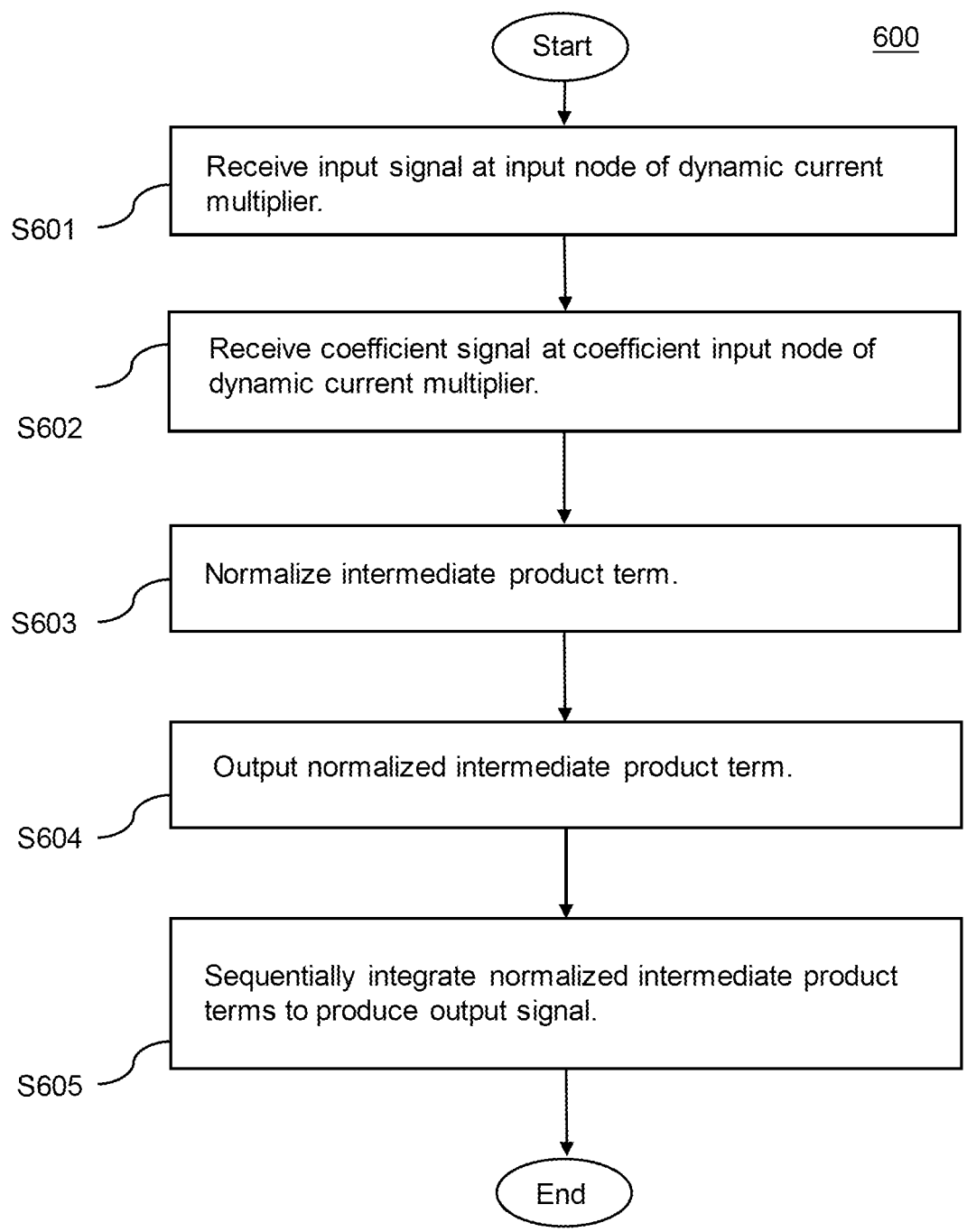
FIG. 6 is a flowchart that shows a method for producing impulse responses by using the dynamic current-mode FIR filter of the disclosed invention.

With reference to FIG. 6, shown is a flowchart that shows a method 600 for producing FIR filter responses by using the dynamic current mode FIR filter 500. Referring to FIG. 6, in block S601, in the dynamic current multiplier 300, an input signal x[n−i] 301 is received at the first input node 341 of first DCT 310 during a first phase of operation of DCT 310. This process S601 is achieved by turning on switches 331, 312 and 333 and turning off switches 332 and 334, via a controller 540, during the first phase of operation of DCT 310.

In block S602, in the dynamic current multiplier 300, a coefficient signal c[i] 302 is received at the second input node 342 of the first DCT 310 during a second phase of operation of DCT 310. This process S602 is achieved by turning off switches 331, 312 and 333 and turning on switches 332 and 334, via controller 540, during the second phase of operation of DCT 310.

In block S603, an intermediate product term is normalized by the current supplied at the third input node 345 from signal source 550. This process S603 is achieved by turning on switches 335, 322 and 337 and turning off switches 336 and 338, via controller 540 during the first phase of operation of DCT 320.

In block S604, a normalized intermediate product term c[i]×c[n−i] is produced at output node 344. This process S604 is achieved by turning on switches 336 and 338 and turning off switches 335, 322 and 337, via controller 540 during the second phase of operation of DCT 320.

In block S605, the normalized intermediate product terms are sequentially integrated by accumulator 530, to the FIR output y[n] for the input value x[n]. This process S605 is achieved by adding the normalized intermediate product term c[i]×c[n−i] to the previously integrated normalized product terms (for the smaller indices of i) supplied by DCM 532, and storing the sum in DCM 531. The content of DCM 531 is then copied back to DCM 532. At the end of the integration period, the output signal $y[n]\Sigma_{i=0}^{N-1}c[j]\times x[n-i]$ is produced by accumulator 530.

Since many modifications, variations, and changes in detail can be made to the described preferred embodiments of the invention, it is intended that all matters in the foregoing description and shown in the accompanying drawings be interpreted as illustrative and not in a limiting sense. Consequently, the scope of the invention should be determined by the appended claims and their legal equivalents.

What is claimed is:

1. A dynamic current-mode finite impulse response (FIR) filter, comprising:
  a coefficient signal generator configured to generate a coefficient signal that includes a plurality of continuous or discrete amplitude coefficient values;
  an input signal generator configured to generate an input signal that includes a plurality of continuous or discrete amplitude input values, wherein the input signal generator comprises a plurality of dynamic current mirrors (DCMs) to output the continuous or discrete amplitude input values;
  a dynamic current multiplier configured to receive the input signal and the coefficient signal and to generate intermediate product terms that are multiplications of the coefficient values and reflected and shifted input values, wherein the dynamic current multiplier comprises:
    a first dynamically configured transistor (DCT) comprising an input node to receive the first input signal during a first phase of operation and a second signal during a second phase of operation; and
    a second DCT comprising an input node to receive a third input signal during a first phase of operation, and to output the intermediate product terms during a second phase of operation, wherein a source node of the first DCT is coupled to a source node of the second DCT; and an accumulator configured to receive the intermediate product terms and to sequentially integrate the intermediate product terms over the coefficient values to produce output responses for the input values.

2. The dynamic current-mode FIR filter of claim 1 wherein the dynamic current multiplier comprises a signal input node coupled to an input signal memory to sequentially receive the input signal values.

3. The dynamic current-mode FIR filter of claim 1 wherein the dynamic current multiplier comprises a coefficient input node coupled to the coefficient signal generator to sequentially receive the coefficient values.

4. The dynamic current-mode FIR filter of claim 1 wherein each of the first and second DCTs of the dynamic current multiplier comprises:

the input node, the source node, and an output node;

a transistor comprising a drain connected to the input node, and a source connected to the source node;

an internal switch comprising a first terminal connected to the input node, and a second terminal connected to a gate of the transistor, wherein the internal switch is configured to be turned on during a first phase of operation and turned off during a second phase of operation; and at least one capacitor comprising a first terminal connected to the second terminal of the internal switch and the gate of the transistor.

5. The dynamic current-mode FIR filter of claim 4 wherein the transistors of the first and second DCTs are both n-channel metal-oxide semiconductor (NMOS) transistors or both p-channel metal-oxide semiconductor (PMOS) transistors.

6. The dynamic current-mode FIR filter of claim 1 wherein the accumulator comprises:

a first DCM configured to store previously sequentially integrated intermediate product terms; and a second DCM configured to integrate currently received intermediate product term into the previously sequentially integrated intermediate product terms.

7. The dynamic current-mode FIR filter of claim 6 wherein the one DCM of the accumulator comprises a PMOS transistor, and the other DCM of the accumulator comprises a NMOS transistor.

8. The dynamic current-mode FIR filter of claim 1 wherein the coefficient signal generator comprises DCMs to generate the continuous or discrete amplitude coefficient values.

9. A method to produce desired output responses by using a dynamic current-mode finite impulse response (FR) filter, comprising:

receiving an input signal at an input node of a first dynamically configured transistor (DCT) during a first phase of operation, wherein the input signal includes a plurality of continuous or discrete amplitude input values, wherein the input values are generated by an input signal generator comprising a plurality of dynamic current mirrors (DCMs) to output the input values;

receiving a coefficient signal at a coefficient input node, wherein the coefficient signal includes a plurality of continuous or discrete amplitude coefficient values;

normalizing intermediate product terms that are multiplications of the coefficient values and reflected and shifted input values;

outputting the normalized intermediate product terms at an output node of a second DCT during a second phase of operation, wherein a source node of the first DCT is coupled to a source node of the second DCT; and sequentially integrating the normalized intermediate product terms over the coefficient values to produce output responses for the input values.

10. The method of claim 9 further comprising receiving a third input signal at the input node of the second DCT during the first phase of operation, wherein the third input signal is used to normalize the intermediate product terms.

11. The method of claim 9 wherein the sequentially integrating the normalized intermediate product terms comprises:

storing previously sequentially integrated intermediate product terms at a first DCM of an accumulator; and integrating currently received intermediate product term into the previously sequentially integrated intermediate product terms at a second DCM of the accumulator.

12. The method of claim 9 wherein each of the first and second DCTs of the dynamic current multiplier comprises:

the input node, the source node and an output node;

a transistor comprising a drain connected to the input node, and a source connected to the source node;

an internal switch comprising a first terminal connected to the input node, and a second terminal connected to a gate of the transistor, wherein the internal switch is configured to be turned on during a first phase of operation and turned off during a second phase of operation; and at least one capacitor comprising a first terminal connected to the second terminal of the internal switch and the gate of the transistor.

13. The method of claim 12, wherein the transistors of the first and second DCTs are both n-channel metal-oxide semiconductor (NMOS) transistors or both p-channel metal-oxide semiconductor (PMOS) transistors.

* * * * *